United States Patent [19]
Rios

[11] Patent Number: 5,247,250
[45] Date of Patent: Sep. 21, 1993

[54] INTEGRATED CIRCUIT TEST SOCKET

[75] Inventor: Juan P. Rios, Austin, Tex.

[73] Assignee: Minnesota Mining and Manufacturing Company, St. Paul, Minn.

[21] Appl. No.: 859,149

[22] Filed: Mar. 27, 1992

[51] Int. Cl.$^5$ .................. G01R 31/02; H01R 13/635
[52] U.S. Cl. ...................... 324/158 F; 324/158 P; 439/70
[58] Field of Search .................. 439/70–73, 439/331; 324/158 P, 158 F, 72.5

[56] References Cited

U.S. PATENT DOCUMENTS

| | | | |
|---|---|---|---|
| 3,954,175 | 5/1976 | Mason | 439/70 |
| 4,130,327 | 12/1978 | Spaulding | 339/17 |
| 4,341,433 | 7/1982 | Cherian et al. | 339/176 |
| 4,349,238 | 9/1982 | Showman et al. | 439/70 |
| 4,376,560 | 3/1983 | Olsson et al. | 339/17 |
| 4,378,139 | 3/1983 | Griffin et al. | 339/75 |
| 4,533,192 | 8/1985 | Kelley | 339/45 |
| 4,535,887 | 8/1985 | Egawa | 206/328 |
| 4,553,805 | 11/1985 | Aikens | 339/75 |
| 4,621,884 | 11/1986 | Berkebile, Jr. et al. | 339/75 |
| 4,750,890 | 6/1988 | Dube et al. | 439/70 |
| 4,758,176 | 7/1988 | Abe et al. | 439/331 |
| 4,789,345 | 12/1988 | Carter | 439/71 |
| 4,799,897 | 1/1989 | Mogi et al. | 439/70 |
| 4,931,020 | 6/1990 | Matsuoka et al. | 439/72 |
| 4,962,356 | 10/1990 | Eberlein et al. | 324/158 |
| 4,969,828 | 11/1990 | Bright et al. | 439/68 |
| 4,986,760 | 1/1991 | Petersen et al. | 439/71 |
| 5,055,777 | 10/1991 | Bonelli et al. | 324/158 |
| 5,109,980 | 5/1992 | Matsuoka et al. | 439/73 |
| 5,120,238 | 6/1992 | Marks et al. | 439/331 |
| 5,127,837 | 7/1992 | Shah et al. | 439/331 |

FOREIGN PATENT DOCUMENTS

| | | | |
|---|---|---|---|
| 0398506 | 4/1990 | European Pat. Off. | 33/76 |
| 62-76273 | 4/1987 | Japan | 33/76 |
| 62-76274 | 4/1987 | Japan | 33/76 |
| 0250282 | 10/1990 | Japan | 439/331 |
| 2-309579 | 12/1990 | Japan | 33/76 |

Primary Examiner—Vinh Nguyen
Attorney, Agent, or Firm—Gary L. Griswold; Walter N. Kirn; David W. Anderson

[57] ABSTRACT

A test socket for integrated circuits includes a base and a platform supported above the base upon which may be placed an integrated circuit. The platform is free to tilt in any direction relative to the base to prevent damage to the integrated circuit by unbalanced forces caused by closing of a cover which retains the integrated circuit in contact with the platform.

6 Claims, 3 Drawing Sheets

INTEGRATED CIRCUIT TEST SOCKET

FIELD OF THE INVENTION

The present invention pertains generally to devices that test integrated circuits, and more particularly to an improved test socket which is capable of making, on a repetitive basis, reliable connections between the integrated circuit leads and the test sockets contact pins.

BACKGROUND OF THE INVENTION

Critical integrated circuits are tested at elevated temperatures before being installed in a product because it has been found that a vast majority of these circuits, if prone to failure, will fail in a very short test period. These integrated circuits are frequently encapsulated in rectangular ceramic or plastic packages that have contact pads or leads, which pads or leads are electrically connected to the integrated circuit. To test the integrated circuit it is necessary to make temporary electrical connections to the contact pads or leads on the integrated circuit package. Test sockets which may be soldered to printed circuit boards having the appropriate circuitry for testing a particular integrated circuit have been provided for this purpose.

Most prior designs include a lid which is either hinged to the test socket base along one edge or clipped to the test socket base along several edges, either of which is intended to clamp the integrated circuit down onto the contact pins of the test socket as the lid is closed. Unfortunately, during closure it has been found that the hinged or the clipped lid results in dynamic components of force being exerted in a non-normal direction. The normal direction is defined by a vector perpendicular to the plane of the test socket. Any applied force in other than the normal direction may result in movement of the integrated circuit relative to the contact pins of the test socket and damage to the contact pads or leads of the integrated circuit or cracking or breakage of the ceramic or plastic encapsulating the integrated circuit.

SUMMARY OF THE INVENTION

The present invention compensates for non-normal forces caused by the cover of a test socket during closure by providing a test socket which includes a base having a generally flat lower surface and upstanding walls extending from the lower surface to define an open interior above the lower surface, a platform for supporting the integrated circuit and having dependent legs extending from the platform toward the base lower surface, the legs terminating in ends which project substantially perpendicularly to the extension of the legs, the base walls further including recesses in register with the platform leg ends, which recesses engage the leg ends and prevent movement of the platform away from the base lower surface but permit movement of any portion of the platform toward the base lower surface independently of movement of any other portion of the platform, resilient contacts dispose between the base lower surface and the platform for electrical connection with the integrated circuit on the platform and for supporting the platform in spaced relation to the lower surface while permitting resilient movement of the platform toward the lower surface, a cover for retaining the integrated circuit in contact with the platform and the resilient contacts and a latch releasably retaining the cover relative to the base so that the integrated circuit is retained in contact with the resilient contacts.

The cover may be connected to the base by a hinge or may simply be a flat plate which is retained adjacent the platform by a number of latches.

BRIEF DESCRIPTION OF THE DRAWINGS

The present invention will be more particularly described with reference to the accompanying drawings, wherein like numbers refer to like parts in the several views, and wherein.

DETAILED DESCRIPTION OF THE PREFERRED EMBODIMENT

Figure 1:
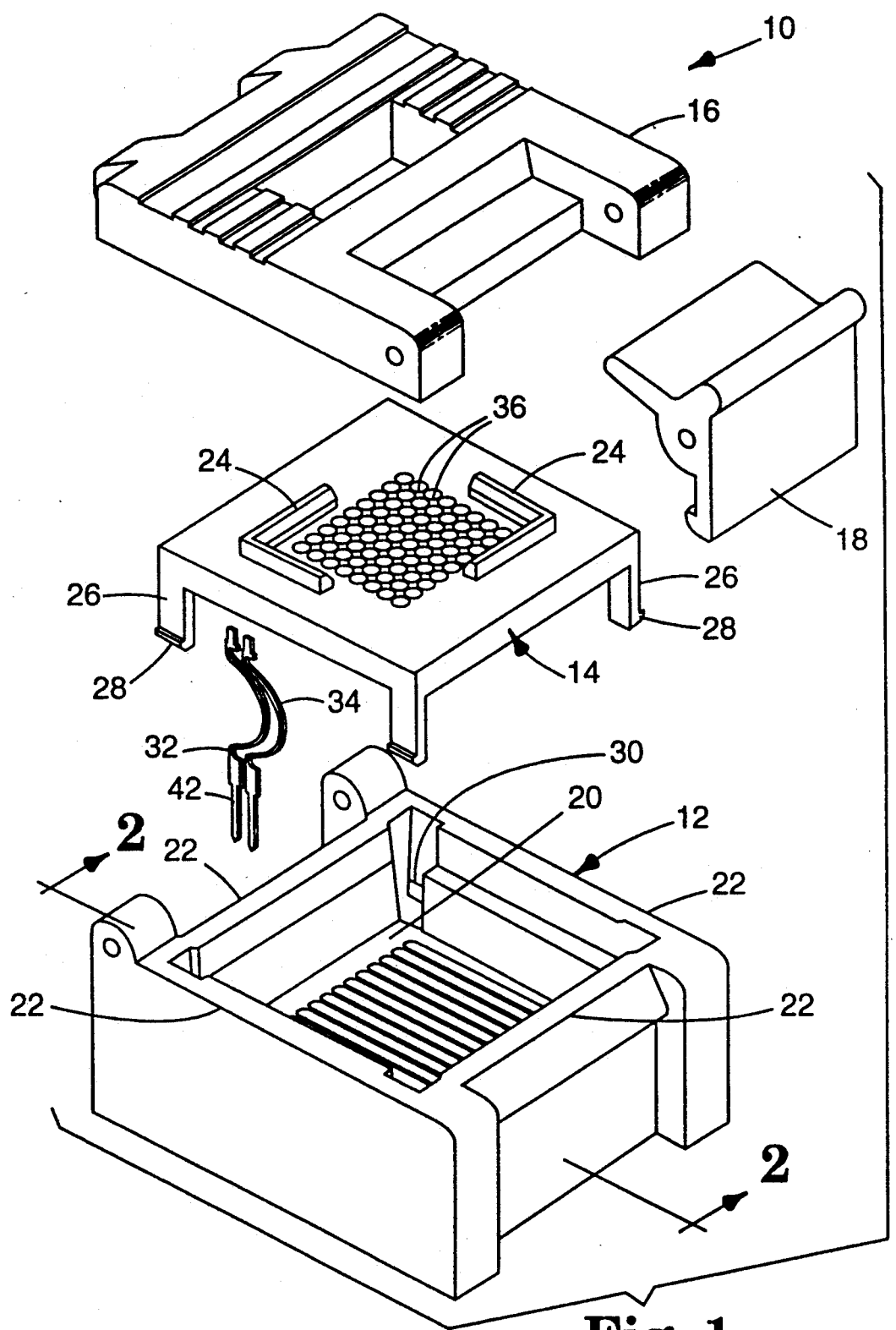
FIG. 1 is an exploded, perspective view of the components of a test socket according to the present invention.

FIGS. 1 through 4 illustrate a test socket, generally indicated as 10, which includes a base 12, a platform 14 for supporting an integrated circuit, a cover 16 which retains the integrated circuit in contact with the platform 14 and a latch 18 which secures the cover 16 to the base 12 and maintains the integrated circuit in contact with the platform 14. The base 12 is comprised of a generally flat lower surface 20 from which extend upwardly four walls 22 to define an open interior space.

Figure 4:
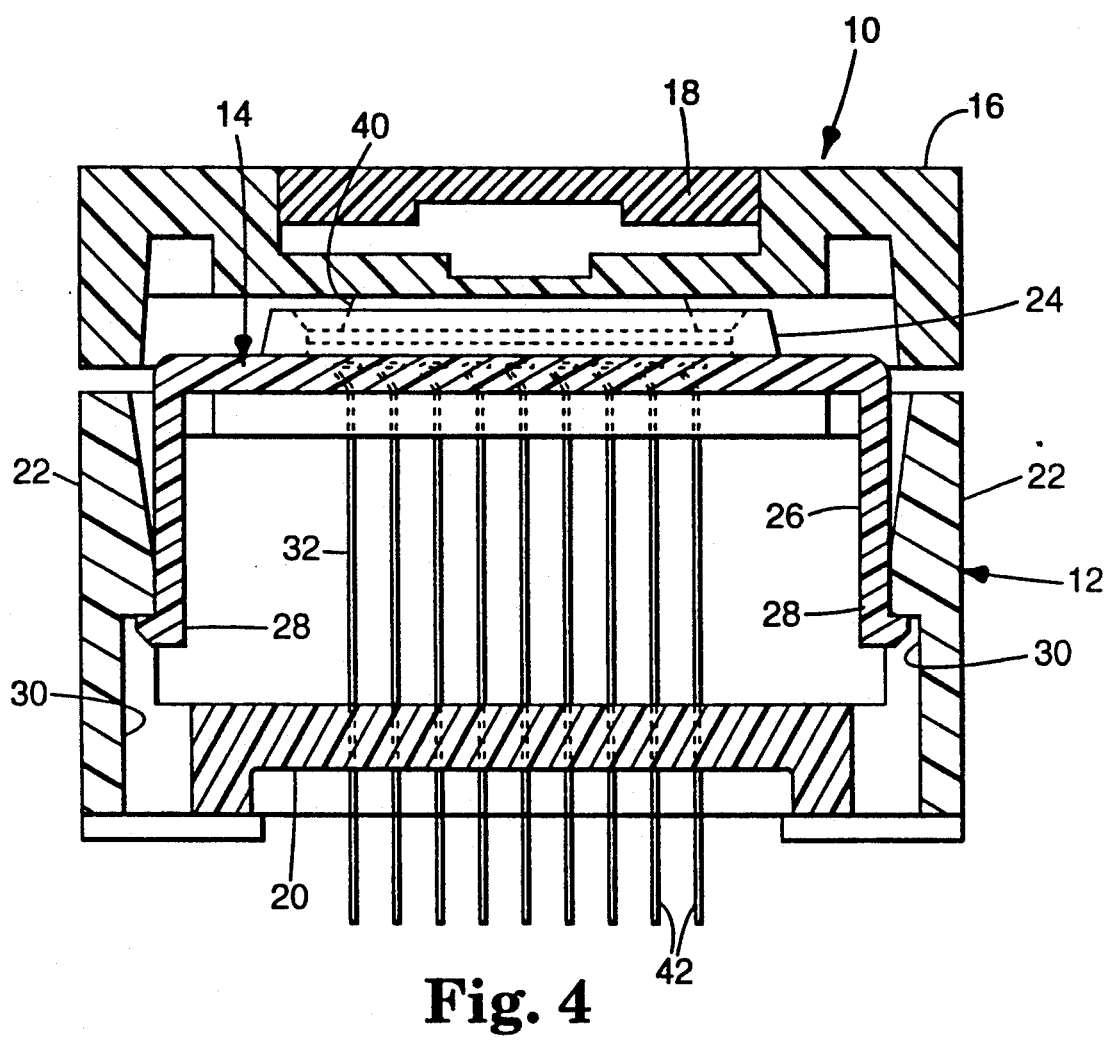
FIG. 4 is a cross-sectional view of the test socket taken generally along the line 4—4 of FIG. 2.

The platform 14 is generally square in shape and includes two raised alignment ridges 24 which define a nest for an integrated circuit (not shown in FIG. 1). Extending from the flat portion of the platform 14 are four legs 26 which terminate in outwardly projecting ends 28 which engage recesses 30 in the base walls 22. This engagement between the platform leg ends 28 and the base recesses 30 acts to prevent the platform 14 from moving in a direction away from the lower surface 20 of the base 12 but the recesses 30 extend for a substantial distance toward the lower surface 20 of the base 12 and thus permit any or all of the legs 26, and the platform 14, to move toward the lower surface 20 of the base 12. Engagement between the legs 26 of the platform 14 and the recesses 30 of the base 12 is best seen in FIG. 4.

Figure 2:
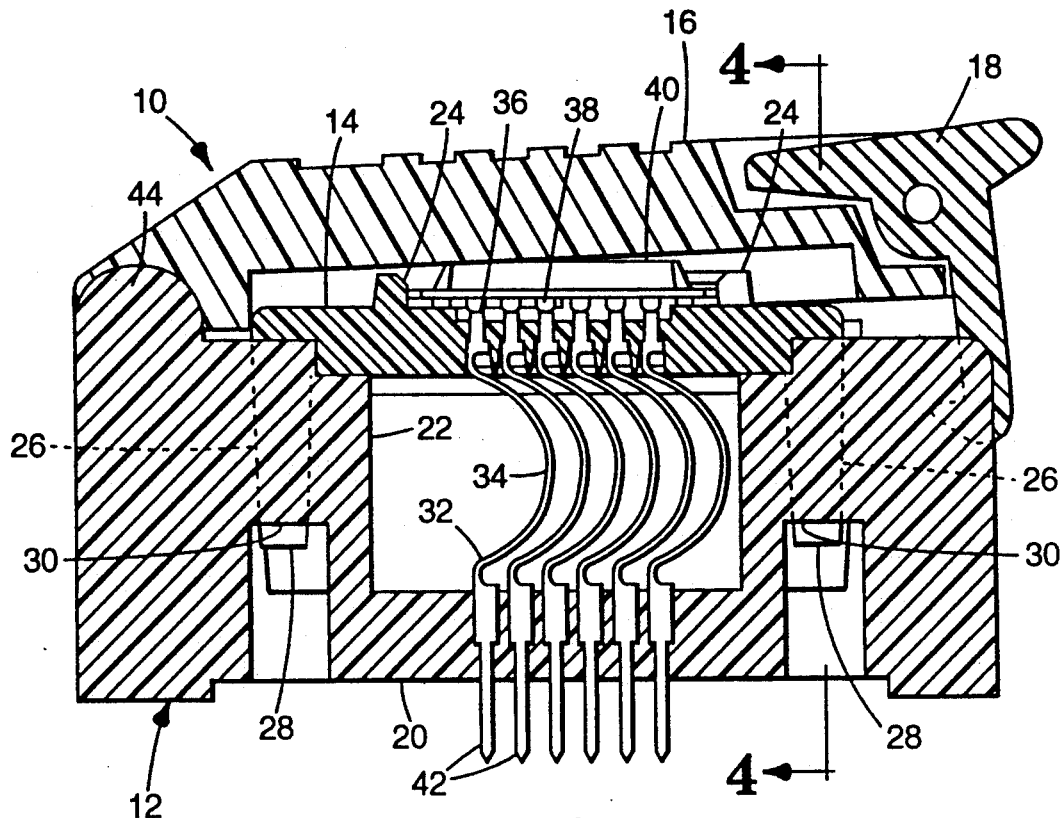
FIG. 2 is a cross-sectional view of the test 15 socket of FIG. 1 taken generally along the line 2—2 of FIG. 1, with a cover positioned at 2° from its fully closed position.
Figure 3:
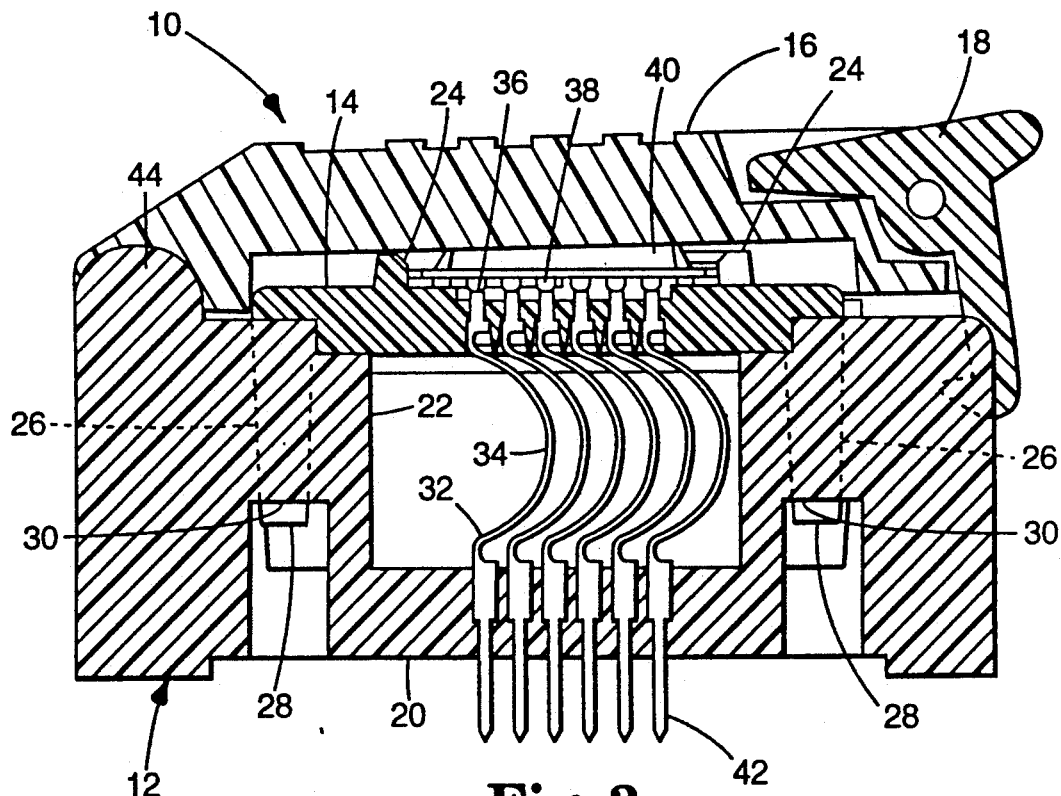
FIG. 3 is a cross-sectional view similar to FIG. 2, with the cover in a position 1° removed from the closed position.

The platform 14 is supported above the lower surface 20 of the base 12 by contact pins 32, as best seen in FIGS. 2 and 3. The contact pins 32 are manufactured of a resilient, electrically conductive metal such as copper and are formed with a bowed central portion 34 to provide the contact pins 32 with a springtype action. The contact pins 32 extend through slots or holes 36 in the platform 14 to contact solder pads 38 formed on the integrated circuit 40. The ends of the contact pins 32 opposite the integrated circuit 40 are formed as blades 42 which extend through the lower surface 20 of the base 12 for electrical connection to holes in a circuit board (not shown) to which the test socket 10 is to be attached. The contact pins 32 are retained relative to the platform 14 and the base 12 by shoulders fitting within enlarged slots or counterbores formed in both the base 12 and the platform 14.

FIG. 2 illustrates the position of the cover 16 when the cover 16 just comes into contact with the integrated circuit 40. Since the cover 16 is attached to the base 12 at a hinge 44 disposed at one end of the cover 16, contact between the cover 16 and the integrated circuit 40 is not simultaneous across the surface of the integrated circuit 40 but rather concentrated along one edge of the integrated circuit 40. This concentration of force on the integrated circuit 40 may result in damage to the integrated circuit contacts or cracking or breakage of the material forming the body of the integrated circuit 40.

It might be possible to alleviate this stress concentration between the cover 16 and the integrated circuit 40 by eliminating the hinge 44 and providing the cover with two latches 18, one at each end of the cover 16, rather than the single latch 18 as illustrated. The cover 16 in this case would be loose and subject to being mislaid, and the concentration of forces would not necessarily be alleviated since there is no guarantee that the cover 16 will always be maintained parallel to the integrated circuit 40 when attached to the base 12.

To eliminate the problem caused by concentration of forces between the cover 16 and the integrated circuit 40, the test socket 10 of the present invention has been provided with a platform 14 which is free to "float" relative to the base 12, that is, any portion of the platform 14 may be depressed relative to the base 12 independently of any other portion of the platform 14. Thus the platform 14 is free to tilt in any direction in response to forces which are unevenly applied to the integrated circuit 40. This motion of the platform 14 is illustrated by FIG. 3 where the cover 16 has been further closed to 1° from the 2° position shown in FIG. 2. It will be seen that the legs 26 adjacent the hinge 44 have moved downwardly toward the lower surface 20 of the base 12 while the legs 26 farther from the hinge 44 have not moved relative to the base 12. Thus the platform 14 has tilted in response to the uneven forces applied by the cover 16 to the integrated circuit 40 and by doing so will prevent any damage to the integrated circuit 40. Further movement of the cover 16 toward the base 12 from the position shown in FIG. 3 will cause the platform legs 26 distant from the hinge 44 to likewise move toward the lower surface 20 of the base 12 to a position where the lower surface 20 of the base 12, the platform 14 and the cover 16 are all parallel. At this final position forces applied to the integrated circuit 40 by the cover 16 are evenly distributed across the surface of the integrated circuit 40 and will result in good contact between the solder pads 38 of the integrated circuit 40 and the contact pins 32.

The present invention has been described with respect to only a single embodiment, but many modifications will be apparent to those skilled in the art. For example, the legs 26 need not be located at the corners of the platform 14 but could be positioned anywhere around the perimeter of the platform 14. The ends 28 of the legs 26 could extend inwardly rather than outwardly and any number of legs 26 could be provided, although a minimum of two should be provided to lend stability to the platform 14. Finally, the latch or latches 18 could be connected to either the cover 16 as shown or the base walls 22.

I claim:

1. A test socket for integrated circuits comprising:
a base;
a platform supporting the integrated circuit;
resilient contacts for electrical connection to said integrated circuit and for supporting said platform in spaced relationship to said base and permitting resilient movement of said platform relative to said base; and
means for retaining said platform relative to said base at a rest position and for permitting rotational and translational movement of said platform toward said base from said rest position.

2. A test socket according to claim 1 further including a cover removably attached to said base for forcing the integrated circuit into contact with said contacts.

3. A test socket according to claim 2 further including a hinge for attaching said cover to said base.

4. A test socket according to claim 3 further including a latch for retaining said cover in contact with said integrated circuit.

5. A test socket according to claim 1 wherein said means for retaining said platform includes legs depending from said platform toward said base, which legs terminate in projections extending substantially perpendicularly to said legs, and wherein said base further includes walls interacting with said leg projections to permit movement of said legs toward said base but not away from said base.

6. A test socket for integrated circuits comprising:
a base having a generally flat lower surface and upstanding walls extending from said lower surface to define an open interior above said lower surface;
a platform for supporting the integrated circuit and having at least two dependent legs extending from said platform toward said base lower surface, said legs terminating in ends which project substantially perpendicularly to the extension of said legs;
said base walls including recesses in register with said platform leg ends, which recesses engage said leg ends and prevent movement of said platform away from said base lower surface but permit movement of any portion of said platform toward said base lower surface independently of movement of any other portion of said platform toward said base;
resilient contacts disposed between said base lower surface and said platform for electrical connection with the integrated circuit on said platform and for supporting said platform in spaced relation to said lower surface while permitting resilient movement of said platform toward said lower surface;
a cover and a hinge connecting said cover to said base adjacent one of said base walls and permitting rotational movement of said cover relative to said base; and
a latch releasably retaining said cover relative to said base so that said integrated circuit is retained in contact with said resilient contacts.

* * * * *